(12) United States Patent
Iida et al.

(10) Patent No.: US 9,040,312 B2
(45) Date of Patent: May 26, 2015

(54) METHOD FOR PRODUCING FERROELECTRIC THIN FILM

(71) Applicant: MITSUBISHI MATERIALS CORPORATION, Tokyo (JP)

(72) Inventors: Shintaro Iida, Naka (JP); Hideaki Sakurai, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/061,035

(22) Filed: Oct. 23, 2013

(65) Prior Publication Data

US 2014/0141531 A1    May 22, 2014

(30) Foreign Application Priority Data

Nov. 20, 2012  (JP) .................................. 2012-253783

(51) Int. Cl.
| | |
|---|---|
| *H01L 21/00* | (2006.01) |
| *H01L 41/39* | (2013.01) |
| *H01L 21/02* | (2006.01) |
| *H01L 49/02* | (2006.01) |
| *H01L 41/318* | (2013.01) |

(52) U.S. Cl.
CPC .......... *H01L 41/39* (2013.01); *H01L 21/02197* (2013.01); *H01L 21/02282* (2013.01); *H01L 21/02315* (2013.01); *H01L 28/55* (2013.01); *H01L 28/65* (2013.01); *H01L 41/318* (2013.01)

(58) Field of Classification Search
CPC .............. H01L 28/55; H01L 27/11502; H01L 27/11507; H01L 43/12; H01L 21/31691; H01L 28/40; H01L 21/31604; H01L 27/10852; H01L 28/60; H01L 41/39; H01L 21/02197; H01L 21/02282; H01L 41/318
USPC ............................ 438/3, 240, 386, 393, 396
See application file for complete search history.

(56) References Cited

U.S. PATENT DOCUMENTS

| | | | |
|---|---|---|---|
| 2002/0102791 A1* | 8/2002 | Kurasawa et al. ............ | 438/240 |
| 2004/0029399 A1 | 2/2004 | Honma et al. | |

FOREIGN PATENT DOCUMENTS

| | | |
|---|---|---|
| JP | 06-116095 A | 4/1994 |
| JP | 2011-029399 A | 2/2011 |

OTHER PUBLICATIONS

European Search Report Dated Feb. 11, 2014, issued for the corresponding European patent application No. 13193249.3.

* cited by examiner

*Primary Examiner* — Michelle Mandala
(74) *Attorney, Agent, or Firm* — Locke Lord LLP; James E. Armstrong, IV

(57) ABSTRACT

It is possible to produce a ferroelectric thin film controlled to have the preferential crystal orientation in the (100) plane with a simple process without providing a seed layer or a buffer layer. A ferroelectric thin film is produced on a lower electrode by irradiating a surface of the lower electrode of a substrate having the lower electrode where the crystal plane is oriented in a (111) axis direction, with an atmospheric pressure plasma, coating a composition for forming a ferroelectric thin film on the lower electrode, and heating and crystallizing the coated composition.

5 Claims, 2 Drawing Sheets

10 SUBSTRATE
11 LOWER ELECTRODE
14 FERROELECTRIC THIN FILM

US 9,040,312 B2

METHOD FOR PRODUCING FERROELECTRIC THIN FILM

TECHNICAL FIELD

The present invention relates to a method for producing a ferroelectric thin film that is controlled to have preferential crystal orientation in the (100) plane with a simple process.

BACKGROUND ART

In recent years, a ferroelectric thin film used as a capacitor and a piezoelectric element has been widely developed so as to satisfy the requirements for downsizing an electronic device.

Lead zirconate titanate (PZT) is a ferroelectric material that has a perovskite structure and shows an excellent dielectric characteristic. A CDS (Chemical Solution Deposition) method using sol-gel solution has been attracting attention in producing a thin film capacitor where the PZT is used as a material for ferroelectric thin film, as its film formation process is inexpensive and a uniform film composition can be obtained in a substrate plane.

In the formation of such a ferroelectric thin film by the CDS method using a sol-gel solution, it is possible to produce a ferroelectric thin film having crystals with preferential orientation in a (111) plane depending on the (111) axis direction of the lower electrode, by forming platinum (Pt) or iridium (Ir), where a crystal plane is oriented in the (111) axis direction, as the lower electrode on a substrate and forming the ferroelectric thin film on the lower electrode. Since such a ferroelectric thin film having crystals with preferential orientation in the (111) plane has high withstand voltage and life-time reliability, the ferroelectric thin film is preferably utilized in the application such as an IPD (Integrated Passive Device) or a non-volatile memory.

In addition, conventional methods known to have crystals with preferential orientation in the (100) plane or (110) plane on the lower electrode oriented in the (111) axis direction include using a material different from the ferroelectric thin film as a seed layer and introducing a material different from the ferroelectric thin film as a buffer layer so as to suppress the influence of the lower electrode. Since the ferroelectric thin film having crystals with preferential orientation in the (100) plane has a large piezoelectric constant $e_{31}$, it is preferably utilized in the application such as an actuator. Furthermore, since the ferroelectric thin film having crystals with preferential orientation in the (110) plane has a large dielectric constant, it is preferably utilized in the application such as a capacitor.

There is a disclosure of a method for producing a ferroelectric film as a technique introducing a buffer layer (for example, see Patent Document 1). The method for producing a ferroelectric film includes: a step of forming a base film oriented to a predetermined crystal plane on a substrate; a step of forming a carbon film on the base film; a step of forming an amorphous thin film containing a ferroelectric material on the carbon film; and a step of forming a ferroelectric film on the base film by heating the amorphous thin film to crystallize the amorphous thin film. The ferroelectric film produced by this method is oriented to a crystal plane different from a predetermined crystal plane, and the ferroelectric material is formed from at least one of: the perovskite structure and bismuth layered-structure oxide; superconducting oxide; tungsten-bronze structure oxide; at least one material selected from the group consisting of CaO, BaO, PbO, ZnO, MgO, $B_2O_3$, $Al_2O_3$, $Y_2O_3$, $La_2O_3$, $Cr_2O_3$, $Bi_2O_3$, $Ga_2O_3$, $ZrO_2$, $TiO_2$, $HfO_2$, $NbO_2$, $MoO_3$, $WO_3$ and $V_2O_5$; a material containing $SiO_2$ in at least one material selected from the group consisting thereof; and a material containing $SiO_2$ and $GeO_2$ in at least one material selected from the group consisting thereof. In Patent Document 1, the crystal orientation of the ferroelectric film formed on the carbon film is controlled by adjusting the thickness of the carbon film formed as a buffer layer. Patent Document 1 shows the control of the crystal orientation that the orientation of the PZT is controlled to have (111) plane+(001) plane orientation when the thickness x of a DLC (diamond like carbon) film which is the carbon film is in the range of 0 nm<x<10 nm, the orientation of the PZT is controlled to have (001) plane orientation when the thickness x of the DLC film is 10 nm, the orientation of the PZT is controlled to have (001) plane+(110) plane orientation when the thickness x of the DLC film is in the range of 10 nm<x<100 nm, the orientation of the PZT is controlled to have (110) plane orientation when the thickness x of the DLC film is 100 nm, and the orientation of the PZT is controlled to have weak (110) plane orientation when the thickness x of the DLC film is larger than 100 nm.

Patent Document 1 also discloses that it is possible to produce a PZT film having (001) orientation on the lower electrode having (111) orientation using a buffer layer where $LaNiO_3$ strongly self-oriented in the (001) direction is stacked on the lower electrode.

However, the method in Patent Document 1 described above requires complicated processes including introduction of the seed layer or the buffer layer. In addition, there is a concern that the presence of such a seed layer or a buffer layer may cause deterioration of characteristics of the ferroelectric thin film, contamination, or the like.

In addition, as a method for controlling the crystal orientation of the ferroelectric thin film, there is a disclosure of a method for controlling the crystal orientation of the ferroelectric thin film including: coating a precursor solution of PZT or PLZT on a platinum substrate where a crystal plane is oriented in the (111) axis direction and heating the substrate to form a ferroelectric thin film, in which the substrate that has been coated with the precursor solution is firstly subjected to a heat treatment in the temperature range of 150° C. to 55° C. to achieve a desired crystal orientation, and is subsequently subjected to the firing in the temperature range of 550° C. to 800° C. and the crystallizing of the precursor to preferentially orient the crystal plane of the thin film in a certain axis direction depending on the heat treatment temperature (for example, see Patent Document 2). In Patent Document 2, the crystal orientation of the ferroelectric thin film is controlled depending on the temperature range of heat treatment corresponding to preliminary firing, thereby forming a ferroelectric film having the controlled crystal orientation on the lower electrode directly without introducing the seed layer or the buffer layer. Patent Document 2 concretely shows the control of the crystal orientation such that the preferential orientation in the (111) plane is achieved by the heat treatment at 150° C. to 250° C., the preferential orientation in the (111) plane and the (100) plane is achieved by the heat treatment at 250° C. to 350° C., and the preferential orientation in the (100) plane and the (200) plane is achieved by the heat treatment at 450° C. to 550° C.

RELATED ART DOCUMENT

Patent Document

[Patent Document 1] Japanese Unexamined Patent Application Publication No. 2011-29399 (Claim 7, paragraphs [0003], [0022] to [0026] and [0039], and FIG. 1)

[Patent Document 2] Japanese Unexamined Patent Application Publication No. 6-116095 (Claims 1 to 4, paragraphs [0005] and [0006], and FIG. 1)

DISCLOSURE OF THE INVENTION

Problem that the Invention is to Solve

However, the applicability of the above-described method disclosed in Patent Document 2 is limited or the performance of the film is insufficient in a particular application since the achieved preferential orientation includes plural orientation planes, for example, (111) plane and (100) plane, or (100) plane and (200) plane.

An object of the present invention is to provide a method for producing a ferroelectric thin film that is controlled to have preferential crystal orientation in the (100) plane with a simple process without providing a seed layer or a buffer layer Means for Solving the Problem Based on the extensive research by the inventors for a ferroelectric thin film having the preferential orientation in the related art, it was found that a ferroelectric thin film controlled to have the preferential crystal orientation in the (100) plane being independent of the (111) axis direction of the lower electrode could be produced with a simple process without requiring overparticular and complicated processes in the producing of the film when forming the ferroelectric thin film using a sol-gel method by: irradiating the surface of the lower electrode of the substrate having the lower electrode where the crystal plane is oriented in the (111) axis direction with an atmospheric pressure plasma; coating a composition for forming a ferroelectric thin film on the lower electrode; drying and preliminarily firing the coated composition to form a gel film; and firing and crystallizing the gel film. The present invention has been developed based on the above-described findings.

A first aspect of the present invention is a method for producing a ferroelectric thin film on a lower electrode by coating a composition for forming a ferroelectric thin film on the lower electrode of a substrate having the lower electrode where a crystal plane is oriented in the (111) axis direction, calcining the coated composition, and then firing and crystallizing the coated composition, the method including: irradiating a surface of the lower electrode with an atmospheric pressure plasma before coating the composition for forming a ferroelectric thin film; and coating, calcining and firing the composition for forming a ferroelectric thin film on the lower electrode to form the ferroelectric thin film controlled to have a preferential crystal orientation in the (100) plane.

A second aspect of the present invention is the method for producing a ferroelectric thin film based on the first aspect, in which an introduction gas when the lower electrode is irradiated with the atmospheric pressure plasma may be oxygen ($O_2$) or nitrogen ($N_2$), or a mixture thereof.

A third aspect of the present invention is a method for producing a composite electronic part such as a thin film capacitor, a capacitor, an IPD, a capacitor for a DRAM memory, a stacked capacitor, a gate insulator of a transistor, a non-volatile memory, a pyroelectric infrared sensor, a piezoelectric element, an electro-optic element, an actuator, a resonator, an ultrasonic motor, an electric switch, an optical switch, and an LC noise filter element, using the method for producing a ferroelectric thin film based on the first or second aspect.

Effect of the Invention

In the first aspect of the present invention, a process of irradiating the surface of the lower electrode with the atmospheric pressure plasma before coating the composition for forming a ferroelectric thin film is included in the method for producing the ferroelectric thin film on the lower electrode by coating the composition for forming a ferroelectric thin film on the lower electrode of the substrate having the lower electrode where the crystal plane is oriented in the (111) axis direction, and heating and crystallizing the coated composition. As such, it is possible to produce the ferroelectric thin film controlled to have the preferential crystal orientation in the (100) plane with a simple process without providing the seed layer or the buffer layer, by irradiating the surface of the lower electrode with the atmospheric pressure plasma before coating the composition for forming a ferroelectric thin film.

In the second aspect of the present invention, it is possible to produce the ferroelectric thin film controlled to have the preferential crystal orientation in the (100) plane with a simple process without providing the seed layer or the buffer layer, by setting the introduction gas when irradiating the lower electrode with the atmospheric pressure plasma to oxygen ($O_2$) or nitrogen ($N_2$), or a mixture of thereof.

In the third aspect of the present invention, it is possible to produce a composite electronic part such as a thin film capacitor, a capacitor, an IPD, a capacitor for a DRAM memory, a stacked capacitor, a gate insulator of a transistor, a non-volatile memory, a pyroelectric infrared sensor, a piezoelectric element, an electro-optic element, an actuator, a resonator, an ultrasonic motor, an electric switch, an optical switch, and an LC noise filter element, using the method for producing the ferroelectric thin film based on the first or second aspect.

BEST MODE FOR CARRYING OUT THE INVENTION

Next, Embodiments of the present invention are explained with reference to the drawings.

The present invention is an improved method for producing a ferroelectric thin film 14 on a lower electrode 11 by coating a composition for forming a ferroelectric thin film on the lower electrode 11 of a substrate 10 having the lower electrode 11 where a crystal plane is oriented in the (111) axis direction, and heating and crystallizing the coated composition, as shown in FIGS. 1(a) to 1(f).

Figure 1:
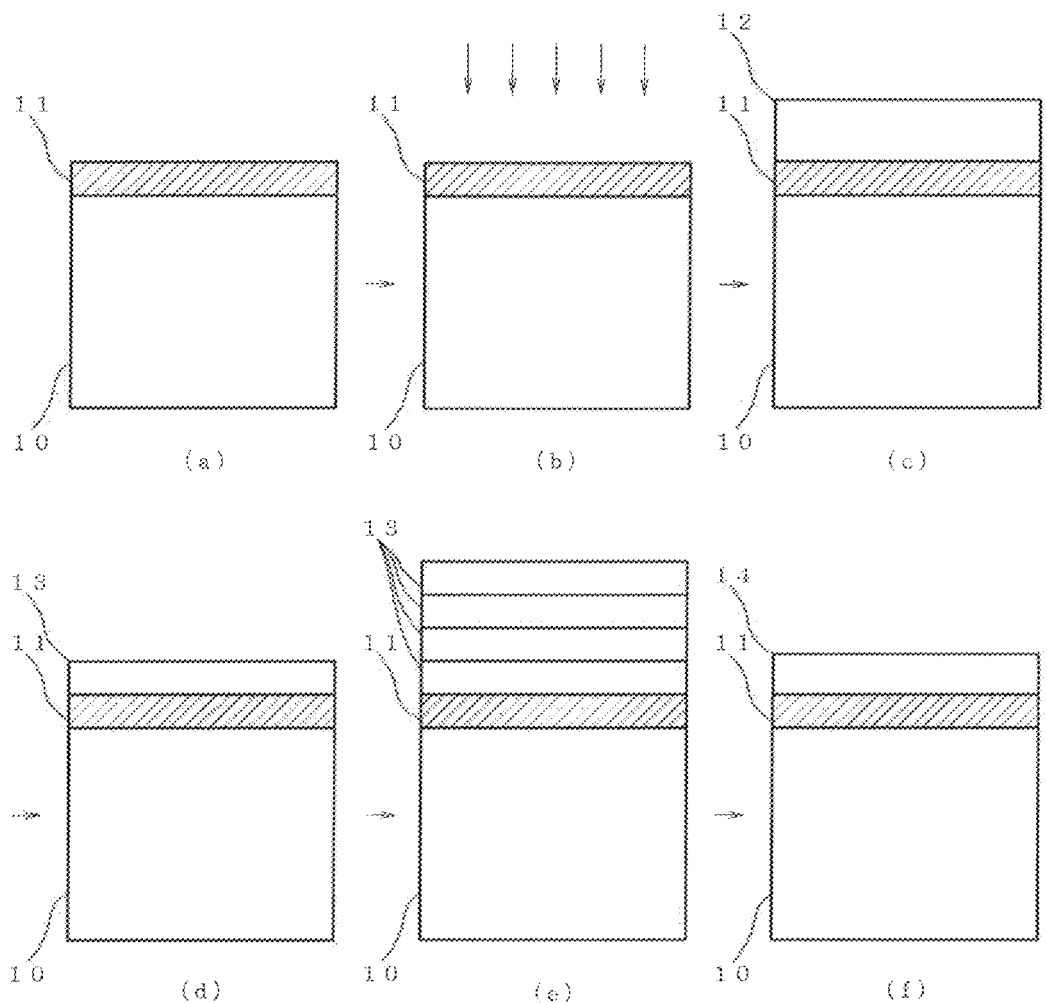
FIGS. 1(a)-(f) are diagrams illustrating a production method of Examples of the present invention.

As shown in FIG. 1(b), the characteristic configuration of the present invention is irradiating the surface of the lower electrode with an atmospheric pressure plasma after forming the lower electrode 11 to form the ferroelectric thin film 14 controlled to have the preferential crystal orientation in the (100) plane. As such, it is possible to produce the ferroelectric thin film controlled to have the preferential crystal orientation in the (100) plane with a simple process without providing a seed layer or a buffer layer, by irradiating the lower electrode with the atmospheric pressure plasma.

Here, the reason why it is possible to form the ferroelectric thin film 14 controlled to have the preferential crystal orientation in the (100) plane by irradiating the lower electrode 11 with the atmospheric pressure plasma is not sufficiently known at this point, but it is considered as follows. When the lower electrode 11 is irradiated with the atmospheric pressure plasma, dissolution of a substance configuring the lower electrode 11 occurs, and then, the dissolved substance is cooled down and coagulated. Therefore, the crystal of a (111) plane once formed collapses and becomes a polycrystalline state. Accordingly, a polycrystalline PZT can be preferentially oriented without being affected by the crystal plane of the lower electrode 11. Therefore, it is inferred that it is possible to form the ferroelectric thin film 14 preferentially oriented in the (100) plane which is original preferential orientation of the PZT, by firing the ferroelectric thin film 14 stacked on the lower electrode 11 irradiated with the atmospheric pressure plasma using a sol-gel method.

A heat-resistant substrate such as a silicon substrate or a sapphire substrate is used as a substrate 10 supporting the ferroelectric thin film 14. In addition, a material which has electro-conductivity such as Pt or Ir and Ru and which is not reacted with the ferroelectric thin film 14 is used as the lower electrode 11 which is formed on the substrate 10 and in which the crystal plane is oriented in the (111) axis direction. It is preferable that the ferroelectric thin film 14 is made of Pb-containing perovskite type oxide, and examples thereof include PZT, PLZT, PMnZT, PNbZT, or the like.

A method for irradiating the surface of the lower electrode 11 of the substrate 10 with the atmospheric pressure plasma using an atmospheric pressure plasma irradiation apparatus is described. It is preferable to use a multi-gas plasma jet apparatus as the atmospheric pressure plasma irradiation apparatus. The irradiation with the atmospheric pressure plasma is performed by adjusting the distance between a plasma generation unit of the above-described apparatus and the lower electrode 11 on the substrate 10 to 2 mm to 3 mm, introducing each gas, preferably an $O_2$ gas or a $N_2$ gas, or a mixture thereof into the apparatus, and generating the atmospheric pressure plasma for 30 seconds.

The composition for forming a ferroelectric thin film is formed of an organic metal compound solution dissolved in an organic solvent such that a raw material for configuring metal composite oxide to be in the ratio providing the desired metal atomic ratio. As a raw material for the metal composite oxide, it is preferable to use a compound in which an organic group is connected to each metallic element such as Pb, La, Zr, and Ti via oxygen or a nitrogen atom of the organic group. For example, the raw material may be one or more compounds selected from a group consisting of metal alkoxide, metal diol complex, metal triol complex, metal carbonate, metal β-diketonate complex, metal β-diketoester complex, metal β-iminoketo complex, and metal amino complex. Especially, metal alkoxide, hydrolysate of the metal alkoxide, or organic salt is preferable as the compound. Among these, examples of a lead compound and a lanthanum compound include acetate (lead acetate: $Pb(OAc)_2$ and lanthanum acetate: $La(OAc)_3$), lead diisopropoxide: $Pb(OiPr)_2$, lanthanum triisopropoxide: $La(OiPr)_3$, and the like. Examples of a titanium compound includes titanium alkoxide such as titanium tetraethoxide: $Ti(OEt)_4$, titanium tetraisopropoxide: $Ti(OiPr)_4$, titanium tetra-n-butoxide: $Ti(OnBu)_4$, titanium tetra-isobutoxide: $Ti(OiBu)_4$, titanium tetra-t-butoxide: $Ti(OtBu)_4$, and titatium dimetoxy-di-isopropoxide: $Ti(OMe)_2(OiPr)_2$. Like the titanium compound described above, it is preferable to use zirconium alkoxide as a zirconium compound. The metal alkoxide may be used as it is, or hydrolysate of the metal alkoxide may be used so as to enhance decomposition.

In the preparation process of the composition for forming a ferroelectric thin film, the raw materials are dissolved at a ratio corresponding to the desired ferroelectric thin film composition in an appropriate solvent, thereby controlling the concentration to a value that is appropriate for coating.

As a typical example of the preparation, the composition for forming a ferroelectric thin film as the precursor solution can be obtained from flow of solution synthesis described below. A Zr source (for example, zirconium tetra-n-butoxide) and a Ti source (for example, titanium isopropoxide), and stabilizing agent (for example, acetylacetone) are put in a reaction vessel and refluxed in a nitrogen atmosphere. Next, a compound after the refluxing is added with a Pb source (for example, lead acetate trihydrate) and solvent (for example, propylene glycol), and is refluxed in the nitrogen atmosphere to obtain a solution. After removing byproducts from the solution by vacuum distillation, concentration of the solution is controlled by further adding propylene glycol to the solution. Further, n-butanol is added to the solution. As a result, the composition for forming a ferroelectric thin film is obtained.

The solvent used in the preparation of the composition for forming a ferroelectric thin film may be appropriately selected depending on the raw materials used for the ferroelectric thin film. In general case, one solvent or a mixture of two or more solvents selected from carboxylic acid, alcohol (for example, propylene glycol as a polyhydric alcohol), ester, ketones, (for example, acetone and methyl ethyl ketone), ethers (for example, dimethyl ether and diethyl ether), cycloalkanes (for example, cyclohexane and cyclohexanol), aromatic solvents (for example, benzene, toluene and xylene), tetrahydrofuran or the like may be used.

As the carboxylic acid, it is preferable to use n-butyric acid, α-methylbutyric acid, i-valeric acid, 2-ethylbutyric acid, 2,2-dimethylbutyric acid, 3,3-dimethyl butyric acid, 2,3-dimethyl butyric acid, 3-methylpentanoic acid, 4-methylpentanoic acid, 2-ethylpentanoic acid, 3-ethylpentanoic acid, 2,2-dimethylpentanoic acid, 3,3-dimethylpentanoic acid, 2,3-dimethylpentanoic acid, 2-ethylhexanoic acid, and 3-ethylhexanoic acid.

As the ester, it is preferable to use ethyl acetate, propyl acetate, n-butyl acetate, sec-butyl acetate, tert-butyl acetate, isobutyl acetate, n-amyl acetate, sec-amyl acetate, tert-amyl acetate and isoamyl acetate. As the alcohol, it is preferable to use 1-propanol, 2-propanol, 1-butanol, 2-butanol, isobutyl alcohol, 1-pentanol, 2-pentanol, 2-methyl-2-pentanol, and 2-methoxy ethanol.

Total concentration of the organic metal compound in the organic metal compound solution of the composition for forming a ferroelectric thin film is preferably controlled in the range of about 0.1% to 20% by mass in terms of the metal oxide-converted amount.

A stabilizing agent may be added to the organic metal compound solution, if necessary, in an amount such that (number of molecules of stabilizing agent)/(number of metal atoms) is about 0.2 to 3. The stabilizing agent may be β-diketones (for example, acetyl acetone, heptafluoro butanoil pivaloyl methane, dipivaloyl methane, trifluoroacetylacetone, benzoylacetone or the like), β-ketonic acids (for example, acetoacetic acid, propionyl acetic acid, benzoyl acetic acid or the like), β-keto esters (for example, lower alkyl esters such as methyl, propyl, or butyl of the above-described ketonic acids), oxyacids (for example, lactic acid, glycol acid, α-oxybutyric acid, salicylic acid or the like), lower alkyl esters of the above-described oxyacids, oxyketones (for example, diacetone alcohol, acetoin, or the like), diol, triol, higher carboxylic acid, alkanolamines (for example, diethanolamine, triethanolamine or monoethanolamine), polyamine and the like.

The composition for forming a ferroelectric thin film preferably includes β-ketone and polyhydric alcohol. More preferably, the composition includes acetyl acetone as the β-ketone and propylene glycol as the polyhydric alcohol.

Preferably, the number of particles contained in the prepared organic metal compound solution is controlled such that the numbers of particles of 0.5 μm or more (particularly 0.3 μm or more, more particularly 0.2 μm or more) in a diameter is to be 50 or less per 1 mL of the solution (50/mL or less) by removing the particles by filtering or the like. In a case where the number of particles of 0.5 μm or more in diameter in the organic metal compound solution exceeds 50/mL, the solution cannot be preserved stably for a long time. In the organic metal compound solution, it is preferable to reduce the number of particles of 0.5 μm or more in diameter to be small as possible, particularly preferably to 30/ml or less.

A treatment method for controlling the number of particles, in the organic metal compound solution after the preparation, to the above-described range is not particularly limited. For example, the following methods can be applied. A first method is a filtering method which uses a commercially available membrane filter having a pore size of 0.2 μm, and in which the solution is sent to the filter under pressure by a syringe. A second method is a pressurized filtering method using a commercially available membrane filter having a pore size of 0.05 μm and a pressurizing tank in combination. A third method is a circulation filtering method using the filter used in the second method and a solution circulating bath in combination.

In any of the method, the ratio of capturing the particles by the filter varies depending on the pressure for sending the solution. It is generally known that the ratio of the capturing increases as the pressure decreases. Particularly in the first and the second methods, it is preferable to filtrate the solution very slowly with low pressure so as to realize the conditions such that the number of particles of 0.5 μm or more in diameter is 50 or less.

A method for forming the ferroelectric thin film 14 shown in FIG. 1(f) using the composition for forming a ferroelectric thin film is as follows. As shown in FIGS. 1(b) to 1(c), a sol film 12 is formed by coating the above-described composition on the lower electrode 11 subjected to the atmospheric pressure plasma using a coating method such as spin coating, dip coating, LSMCD (Liquid Source Misted Chemical Deposition), ESD (Electro Spray Deposition). A gel film 13 is subsequently formed by drying and preliminarily firing the coated composition using a hot plate or the like as shown in FIG. 1(d). Further, the ferroelectric thin film 14 is formed on the lower electrode 11 as shown in FIG. 1(f) by repeating the coating, drying, and preliminary firing of the composition for a plurality of times as shown in FIG. 1(e), forming the gel films 13, 13 . . . in the thickness within a desired range, and firing the stacked gel films in the same time.

Drying and preliminary firing are performed so as to remove the solvent from the coated composition, and to convert the organic metal compound to composite oxide by thermal decomposition or by hydrolysis of the organic metal compound. Therefore, the drying and the preliminary firing are performed under the air atmosphere, oxidizing atmosphere, or water vapor containing atmosphere. Even in the air atmosphere, humidity in the air provides sufficient water component required for the hydrolysis. The heat treatment may be performed by two steps including low-temperature heating for removing the solvent and high-temperature heating for decomposing the organic metal compound.

Firing is a process for firing a thin film obtained by the drying and the preliminary firing at a temperature of not lower than crystallizing temperature, thereby crystallizing the thin film. By this treatment, a ferroelectric thin film 14 is obtained. $O_2$, $N_2$, Ar, $N_2O$, $H_2$ or the like or a mixture thereof is preferably used as a firing atmosphere for the crystallizing process.

Drying and preliminary firing are performed at a temperature range of 150° C. to 550° C. for about 1 to 10 minute(s).

Firing is performed at a temperature range of 450° C. to 800° C. for about 1 to 60 minute(s). The firing may be performed by rapid thermal annealing (RTA treatment). When the firing is performed by the RTA treatment, it is preferable to control the heating rate to 10° C./second to 100° C./second.

The ferroelectric thin film 14 is a Pb-containing perovskite type ferroelectric film. The thickness of the ferroelectric thin film 14 is preferably less than 5000 nm. When the thickness of the ferroelectric thin film 14 is 5000 nm or more, long processing time is required, and thus, dependence of orientation of the ferroelectric thin film itself on the preferential orientation surface deteriorates resulting in small degree of the orientation in the (100) plane.

Thus, the produced ferroelectric thin film 14 of the present invention is controlled to have the preferential crystal orientation in the (100) plane by the irradiation with the atmospheric pressure plasma described above, and has a large piezoelectric constant $e_{31}$.

The method for producing the ferroelectric thin film 14 of the present invention may be used for producing a composite electronic part such as a thin-film capacitor, a capacitor, an IPD, a capacitor for a Dram memory, a staked capacitor, a gate insulator of a transistor, a non-volatile memory, a pyloelectric infrared sensor, a piezoelectric element, an electro-optic element, an actuator, a resonator, an ultrasonic motor, an electric switch, an optical switch, and an LC noise filter element.

EXAMPLES

Next, Examples of the present invention and Comparative Example are explained in detail.

Example 1

First, Zirconium tetra-n-butoxide (Zr source), titanium isopropoxide (Ti source), and acetyl acetone (stabilizing agent) were put in a reaction vessel and were refluxed in a nitrogen atmosphere. Next, the above-described compound after the refluxing was added with lead acetate trihydrate (Pb source) and propylene glycol (solvent), and was refluxed in the nitrogen atmosphere. After removing byproducts from the thus formed solution by vacuum distillation, concentration of the solution was controlled by adding propylene glycol to the solution. Further, a composition for forming a ferroelectric thin film, in which alcohol is added to the solution and the solution is diluted to adjust the concentration to 10% by mass, and which contains metal oxide where the ratio of metals in the ratio in converted oxide was controlled to be Pb/Zr/Ti=110/52/48, is prepared. The above-described organic metal compound solution constituting the composition for forming a ferroelectric thin film was filtrated by sending the solution under pressure by a syringe to a commercial membrane filter having a pore diameter of 0.2 m. As a result, the number of particles of 0.5 μm or more in diameter was 1 per 1 mL of the solution.

Next, a silicon substrate 10 having a diameter of 150 mm where a Pt lower electrode 11 having a thickness of 200 nm was formed using a sputtering method performed on its surface, was prepared as a substrate as shown in FIG. 1(a). As shown in FIG. 1(b), the surface of the lower electrode 11 was irradiated with an atmospheric pressure plasma using $O_2$ as an introduction gas. As shown in FIG. 1(c), a sol film 12 was formed by coating the thus prepared composition for forming a ferroelectric thin film, having the concentration of 10% by mass under conditions with 500 rpm for 3 seconds, and subsequently with 3500 rpm for 15 seconds, using the sputtering method. Next, as shown in FIG. 1(d), the coated composition was dried and preliminarily fired by heating the substrate using a hot-plate at 300° C. for 5 minutes in the air atmosphere to form the gel film 13 having the thickness of 60 nm. Further, as shown in FIG. 1(e), after repeating the coating and preliminary firing of the composition for forming a ferroelectric thin film for six times, the gel films 13, 13 . . . stacked in 6 layers were subjected to firing by heating the substrate to 700° C. with the heating rate of 10° C./second for 1 minute in an oxygen atmosphere, and the composition was crystallized to obtain a ferroelectric thin film 14 having the thickness of 270 nm as shown in FIG. 1(f). This configuration was set as the ferroelectric thin film of Example 1.

Example 2

The same substrate as in Example 1 was prepared to obtain a ferroelectric thin film 14 having the thickness of 270 nm under the same condition as in Example 1 other than that the surface of the lower electrode 11 was irradiated with the atmospheric pressure plasma using $N_2$ as the introduction gas. This configuration was set as the ferroelectric thin film of Example 2.

Example 3

The same substrate as in Example 1 was prepared to obtain a ferroelectric thin film 14 having the thickness of 270 nm under the same condition as in Example 1 other than that the surface of the lower electrode 11 was irradiated with the atmospheric pressure plasma using a mixed gas of $N_2:O_2=75:25$ as the introduction gas. This configuration was set as the ferroelectric thin film of Example 3.

Example 4

The same substrate as in Example 1 was prepared to obtain a ferroelectric thin film 14 having the thickness of 270 nm under the same condition as in Example 1 other than that the surface of the lower electrode 11 was irradiated with the atmospheric pressure plasma using a mixed gas of $N_2:O_2=50:50$ as the introduction gas. This configuration was set as the ferroelectric thin film of Example 4.

Example 5

The same substrate as in Example 1 was prepared to obtain a ferroelectric thin film 14 having the thickness of 270 nm under the same condition as in Example 1 other than that the surface of the lower electrode 11 was irradiated with the atmospheric pressure plasma using a mixed gas of $N_2:O_2=25:75$ as the introduction gas. This configuration was set as the ferroelectric thin film of Example 5.

Comparative Example

The same substrate as in Example 1 was prepared to obtain a ferroelectric thin film 14 having the thickness of 270 nm under the same condition as in Example 1 other than that the surface of the lower electrode 11 was not irradiated with the atmospheric pressure plasma. This configuration was set as the ferroelectric thin film of Comparative Example.

Comparison Between Examples and Comparative Example

Figure 2:
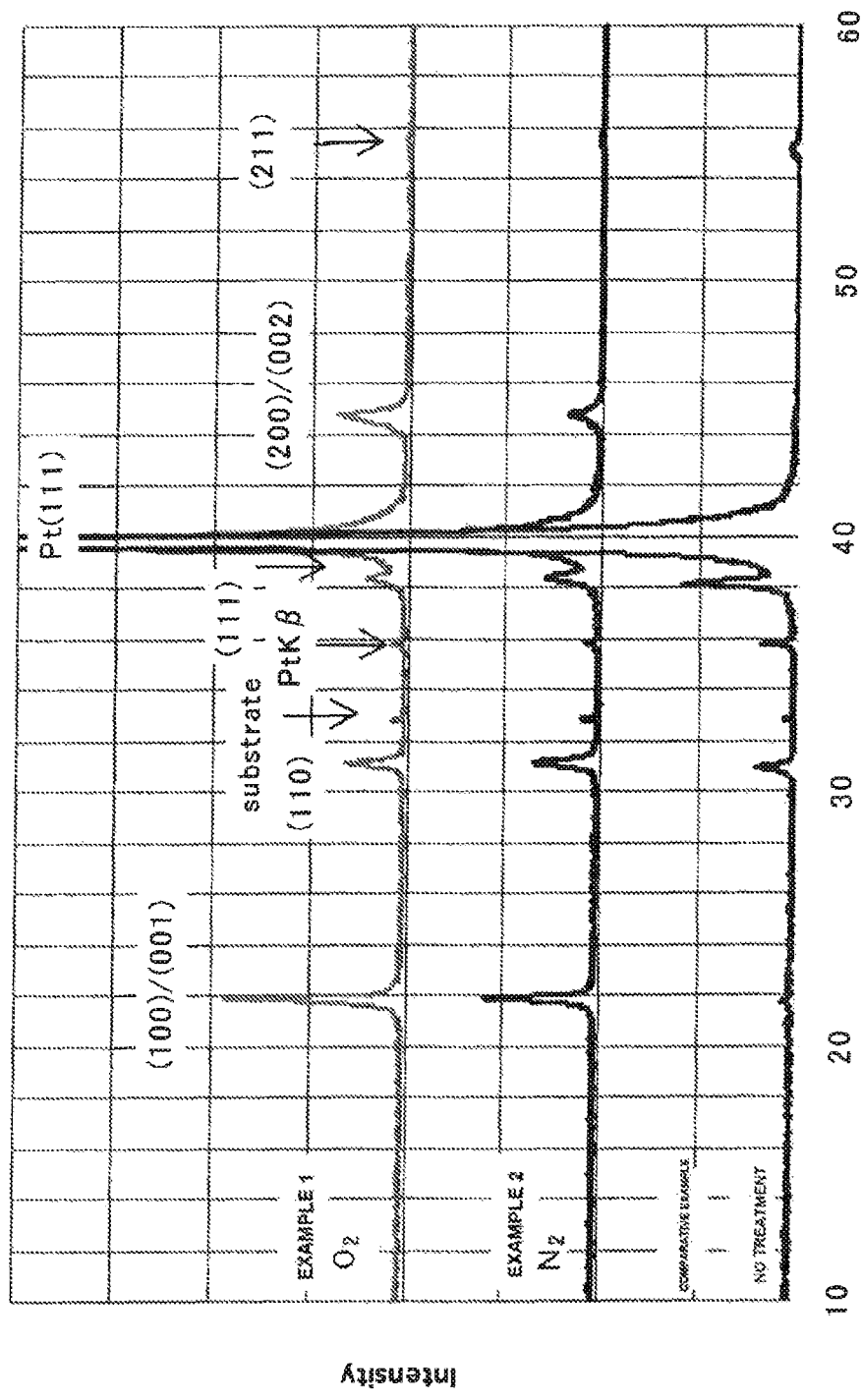
FIG. 2 is a diagram showing XRD patterns of Examples 1 and 2, and Comparative Example.

Examples 1 to 5 and Comparative Example are analyzed using X-ray diffraction (XRD). A plane of preferential orientation of a dielectric crystal was determined by measurement of the ferroelectric thin film 14 using a X-ray diffraction apparatus (XRD: manufactured by Bruker Corporation, MXP18HF). An oriented plane with the highest intensity among the obtained results of diffraction was regarded as a plane of preferential orientation. In addition, degree of orientation in the (100) plane is determined from the results obtained by the X-ray diffraction by calculating (intensity of the (100) plane)/(intensity of the (100) plane+intensity of (110) plane+intensity of (111) plane). FIG. 2 shows respective patterns of XRD in cases with $O_2$ and $N_2$ and without any treatment and Table 1 shows degree of orientation in the (100) plane or the (001) plane in cases of $O_2$, $N_2$, $N_2:O_2=75:25$, $N_2:O_2=50:50$, $N_2:O_2=25:75$ and no treatment. The degree of orientation in the (100) plane or the (001) plane was 0.64, 0.48, 0.50, 0.55, 0.60, 0.08 in the cases with $O_2$, $N_2$, $N_2:O_2=75:25$, $N_2:O_2=50:50$, $N_2:O_2=25:75$ and no treatment, respectively. The degree of orientation in the cases with $O_2$, $N_2$, $N_2:O_2=75:25$, $N_2:O_2=50:50$ and $N_2:O_2=25:75$ was 6 times to 8 times higher than the case with no treatment.

As is clear from FIG. 2 and Table 1, in Examples 1 to 5 of the ferroelectric thin film 14 where the lower electrode is irradiated with the atmospheric pressure plasma in an $O_2$ atmosphere, a $N_2$ atmosphere, and an atmosphere of a mixed gas of $N_2$ and $O_2$, a ferroelectric thin film 14 controlled to have preferential crystal orientation in the (100) plane having high degree of orientation between 0.48 to 0.64 was obtained. On the other hand, it was confirmed that a ferroelectric thin film is controlled to have preferential orientation in the (111) plane in the case with no treatment.

TABLE 1

| | Plane of preferred orientation | Degree of orientation in (100)/(001) plane |
| --- | --- | --- |
| Example 1 ($O_2$) | (100)/(001) | 0.64 |
| Example 2 ($N_2$) | (100)/(001) | 0.48 |
| Example 3 ($N_2:O_2 = 75:25$) | (100)/(001) | 0.50 |
| Example 4 ($N_2:O_2 = 50:50$) | (100)/(001) | 0.55 |
| Example 5 ($N_2:O_2 = 25:75$) | (100)/(001) | 0.60 |
| Comparative Example (No treatment) | (111) | 0.08 |

INDUSTRIAL APPLICABILITY

According to the production method of the present invention, it is possible to produce a ferroelectric thin film having the preferential crystal orientation in the (100) plane with a simple process without providing a seed layer or a buffer layer. In addition, the obtained Pb-containing perovskite type ferroelectric thin film such as a PZT film preferentially oriented in the (100) plane has a large piezoelectric constant, and can be used in an actuator, a sensor, a gyro, an ink-jet head, and MEMS application such as an auto-focusing system, an electric switch or an optical switch.

DESCRIPTION OF REFERENCE NUMERALS
AND SIGNS

10 Substrate
11 Lower Electrode
14 Ferroelectric Thin Film

The invention claimed is:

1. A method for producing a ferroelectric film on a lower electrode by coating a composition for forming a ferroelectric film on the lower electrode of a substrate having the lower electrode where a crystal plane is oriented in the (111) axis direction, calcining the coated composition, and then firing and crystallizing the coated composition, the method comprising:
   irradiating a surface of the lower electrode with an atmospheric pressure plasma before coating the composition for forming a ferroelectric film; and
   coating, calcining and firing the composition for forming a ferroelectric film on the lower electrode to form the ferroelectric film controlled to have a preferential crystal orientation in the (100) plane,
   wherein an introduction gas when the lower electrode is irradiated with the atmospheric pressure plasma is $O_2$ or $N_2$, or a mixture thereof; and
   wherein the composition is an organic metal compound solution that a raw material for a metal composite oxide is dissolved in an organic solvent.

2. A method for producing a composite electronic part such as a film capacitor, a capacitor, an IPD, a capacitor for a DRAM memory, a stacked capacitor, a gate insulator of a transistor, a non-volatile memory, a pyroelectric infrared sensor, a piezoelectric element, an electro-optic element, an actuator, a resonator, an ultrasonic motor, an electric switch, an optical switch, or an LC noise filter element, using the method for producing a ferroelectric film according to claim 1.

3. The method for producing a ferroelectric film according to claim 1, wherein the raw material for the metal composite oxide is one or more compounds in which an organic group is connected to each metallic element which is selected from at least one of a group consisting of Pb, La, Zr, and Ti via oxygen or nitrogen atom of the organic group.

4. The method for producing a ferroelectric film according to claim 1, wherein the raw material for the metal composite oxide is one or more compounds which is selected from at least one of a group consisting of metal alkoxide, hydrolysate of the metal alkoxide, and organic salt of the metal hydroxide wherein the metal is selected from the group consisting of Pb, La, Zr and Ti.

5. The method for producing a ferroelectric film according to claim 1, wherein the raw material for the metal composite oxide is one or more compounds selected from a group consisting of lead acetate($Pb(OAc)_2$), lanthanum acetate ($La(OAc)_3$), titanium tetraisopropoxide ($Ti(OiPr)_4$), titanium tetra-n-butoxide ($Ti(OnBu)_4$), and zirconium alkoxide.

* * * * *